United States Patent
Butz et al.

(10) Patent No.: US 7,267,748 B2
(45) Date of Patent: *Sep. 11, 2007

(54) METHOD OF MAKING COATED ARTICLE HAVING IR REFLECTING LAYER WITH PREDETERMINED TARGET-SUBSTRATE DISTANCE

(75) Inventors: Jochen Butz, Wolfen (DE); Anton Dietrich, Fontnas (CH)

(73) Assignee: Centre Luxembourgeois de Recherches pour le Verre et la Ceramique S.A., Grand Duche de Luxembourg ( * ) Notice: Subject to any disclaimer, the term of this patent is extended or adjusted under 35 U.S.C. 154(b) by 167 days.

This patent is subject to a terminal disclaimer.

(21) Appl. No.: 10/981,745

(22) Filed: Nov. 5, 2004

(65) Prior Publication Data

US 2006/0081457 A1   Apr. 20, 2006

Related U.S. Application Data

(60) Provisional application No. 60/619,687, filed on Oct. 19, 2004.

(51) Int. Cl.
*C23C 14/35* (2006.01)
(52) U.S. Cl. .......................... 204/192.27; 204/192.26; 204/192.28
(58) Field of Classification Search .......... 204/192.12, 204/192.15, 192.26, 192.27, 192.28
See application file for complete search history.

(56) References Cited

U.S. PATENT DOCUMENTS

| | | | |
|---|---|---|---|
| 5,403,458 A | 4/1995 | Hartig et al. | |
| 5,425,861 A | 6/1995 | Hartig et al. | |
| 5,800,933 A | 9/1998 | Hartig et al. | |
| 6,190,776 B1 * | 2/2001 | Demiryont | 428/434 |
| 6,558,800 B1 | 5/2003 | Stachowiak | |
| 6,576,349 B2 | 6/2003 | Lingle et al. | |
| 6,576,566 B2 | 6/2003 | Hashimoto et al. | |
| 6,682,637 B2 | 1/2004 | Heinz et al. | |
| 6,764,945 B2 | 7/2004 | Ashihara et al. | |
| 6,800,179 B2 | 10/2004 | Wang | |

FOREIGN PATENT DOCUMENTS

WO   WO01/73153   * 10/2001

OTHER PUBLICATIONS

U.S. Appl. No. 60/619,687, filed Oct. 19, 2004.

* cited by examiner

*Primary Examiner*—Rodney G. McDonald
(74) *Attorney, Agent, or Firm*—Nixon & Vanderhye P.C.

(57) ABSTRACT

A coated article is provided, where a coating is supported by a substrate. The coating may include at least one infrared (IR) reflecting layer of or including Ag, Au or the like. The IR reflecting layer(s) may be sandwiched between first and second dielectric layers in certain example embodiments of this invention. It has been found that properties of the IR reflecting layer can be improved by reducing the distance between the substrate and the sputtering target(s) used in forming the IR reflecting layer(s).

38 Claims, 4 Drawing Sheets

METHOD OF MAKING COATED ARTICLE HAVING IR REFLECTING LAYER WITH PREDETERMINED TARGET-SUBSTRATE DISTANCE

This application claims priority on U.S. Provisional Application No. 60/619,687, filed Oct. 19, 2004, the entire disclosure of which is hereby incorporated herein by reference.

This invention relates to a method of making a coating article having at least one infrared (IR) reflecting layer of a material such as silver, gold, or the like. In certain example embodiments, an IR reflecting layer(s) is made by sputtering a target(s) that is provided a predetermined distance from the substrate on which the layer is to be formed. This invention may also relate to coated articles made via such a method.

BACKGROUND OF THE INVENTION

Coated articles are known in the art for use in window applications such as insulating glass (IG) window units, monolithic windows, vehicle windows, and/or other suitable applications. It is known that in certain instances, it is desirable to heat treat (e.g., thermally temper, heat bend and/or heat strengthen) such coated articles for purposes of tempering, bending, or the like in certain example instances.

In certain situations, designers of coated articles often strive for a combination of high visible transmission, substantially neutral color, low emissivity (or emittance), and low sheet resistance ($R_s$). High visible transmission for example may permit coated articles to be more desirable in certain window applications, whereas low-emissivity (low-E) and low sheet resistance characteristics permit such coated articles to block significant amounts of IR radiation so as to reduce for example undesirable heating of vehicle or building interiors.

Thus, it will be appreciated that low emittance values and low sheet resistance ($R_s$) are desirable features in many situations. For coated articles having a coating including an IR reflecting layer(s) of Ag or the like, it is the IR reflecting layer(s) that primarily determines the emittance and sheet resistance values of the coated article.

In view of the above, it will be appreciated that reduced emittance and reduced sheet resistance are often desired properties in certain coated articles. Certain example embodiments of this invention seek to provide a method and/or system for making coated articles which permits the coated articles to have reduced emittance and/or sheet resistance values.

BRIEF SUMMARY OF EXAMPLE EMBODIMENTS OF THE INVENTION

In certain example embodiments of this invention, a coated article is provided with a coating on a substrate. The coating may include at least one infrared (IR) reflecting layer of or including Ag, Au or the like. The IR reflecting layer(s) may be sandwiched between first and second dielectric layers in certain example embodiments of this invention.

Surprisingly and unexpectedly, it has been found that properties of the IR reflecting layer can be improved by reducing the distance between the substrate and the sputtering target(s) used in forming the IR reflecting layer(s). For example, it has been found that a reduction in the target-substrate distance for a target(s) used in sputtering an IR reflecting layer(s) results in an IR reflecting layer having one or more of: (a) reduced sheet resistance ($R_s$), (b) reduced emittance or emissivity, (c) improved crystallinity, and/or (d) a higher and thus improved extinction coefficient (k).

Accordingly, in certain example embodiments of this invention, IR reflecting layer(s) are formed by sputtering a target which is located closer to the substrate than conventionally. In certain example embodiments of this invention, IR reflecting layer(s) is/are formed by sputtering where the Ag target being sputtering is located in accordance with a target-substrate distance of less than or equal to about 110 mm, more preferably less than or equal to about 100 mm, more preferably less than or equal to about 95 mm, still more preferably less than or equal to about 90 mm, even more preferably less than or equal to about 80 mm.

In certain example embodiments of this invention, there is provided a method of making a coated article, the method comprising: forming a multi-layer low-E coating on a glass substrate, wherein the glass substrate is from about 1 to 10 mm thick and wherein the coating includes at least one infrared (IR) reflecting layer comprising Ag; and when forming the IR reflecting layer comprising Ag, sputtering a target comprising Ag that is located less than or equal to about 110 mm from a bottom surface of the glass substrate.

In other example embodiments of this invention, there is provided a method of making a coated article, the method comprising: forming a multi-layer coating on a substrate, wherein the coating includes at least one infrared (IR) reflecting layer; and when forming the IR reflecting layer, sputtering a target comprising at least one metal that is located less than or equal to about 110 mm from a bottom surface of the substrate.

In still further example embodiments of this invention, there is provided a method of making a coated article, the method comprising forming a multi-layer coating on a glass substrate, the coating comprising a layer comprising Ag located between at least first and second dielectric layers; and in forming the layer comprising Ag, sputtering at least one target comprising Ag in an atmosphere that includes Kr gas. It has surprisingly been found that the use of Kr gas during the vacuum sputtering process for the IR reflecting layer results in improved k values for an IR reflecting layer comprising Ag, and thus improved resistance and/or emittance properties.

DETAILED DESCRIPTION OF EXAMPLE EMBODIMENTS OF THE INVENTION

This invention relates to a method of making a coating article having at least one infrared (IR) reflecting layer of or including a material such as silver, gold, or the like. In certain example embodiments, an IR reflecting layer(s) is made by sputtering a metal inclusive target(s) that is provided a predetermined distance from the substrate on which the layer is to be formed. This invention may also relate to coated articles made via such a method. Coated articles according to different embodiments of this invention may be used in window applications such as insulating glass (IG) window units, monolithic windows, vehicle windows, and/or in other suitable applications.

Figure 1:
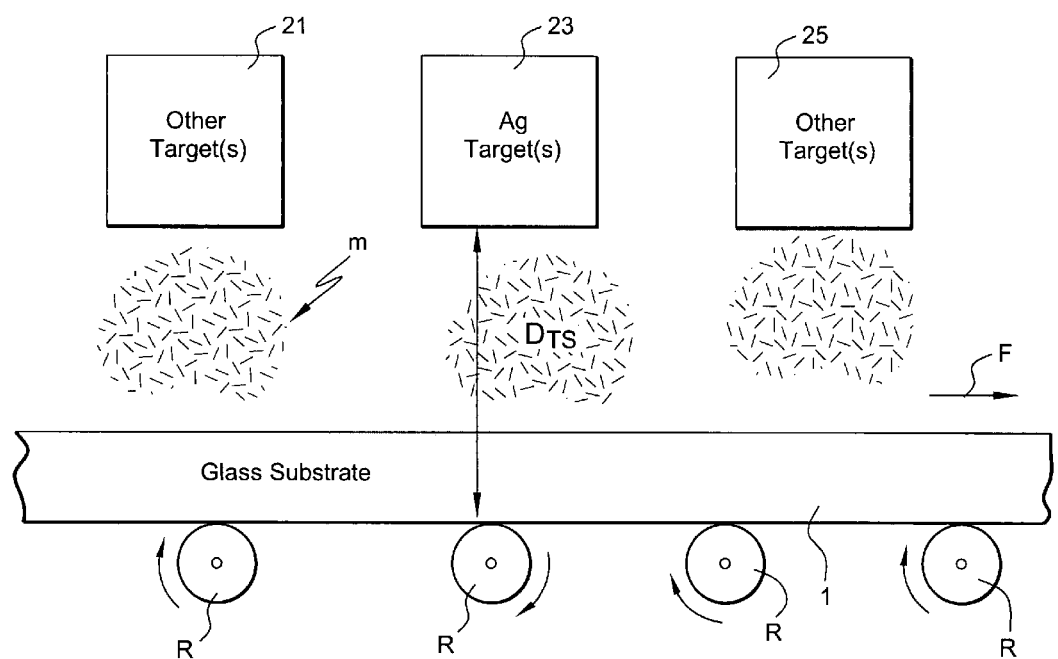
FIG. 1 is a schematic diagram illustrating a sputtering apparatus according to an example embodiment of this invention, including a target-substrate distance ($D_{TS}$) associated with the Ag target(s) used in sputtering IR reflecting layer(s).
Figure 2:
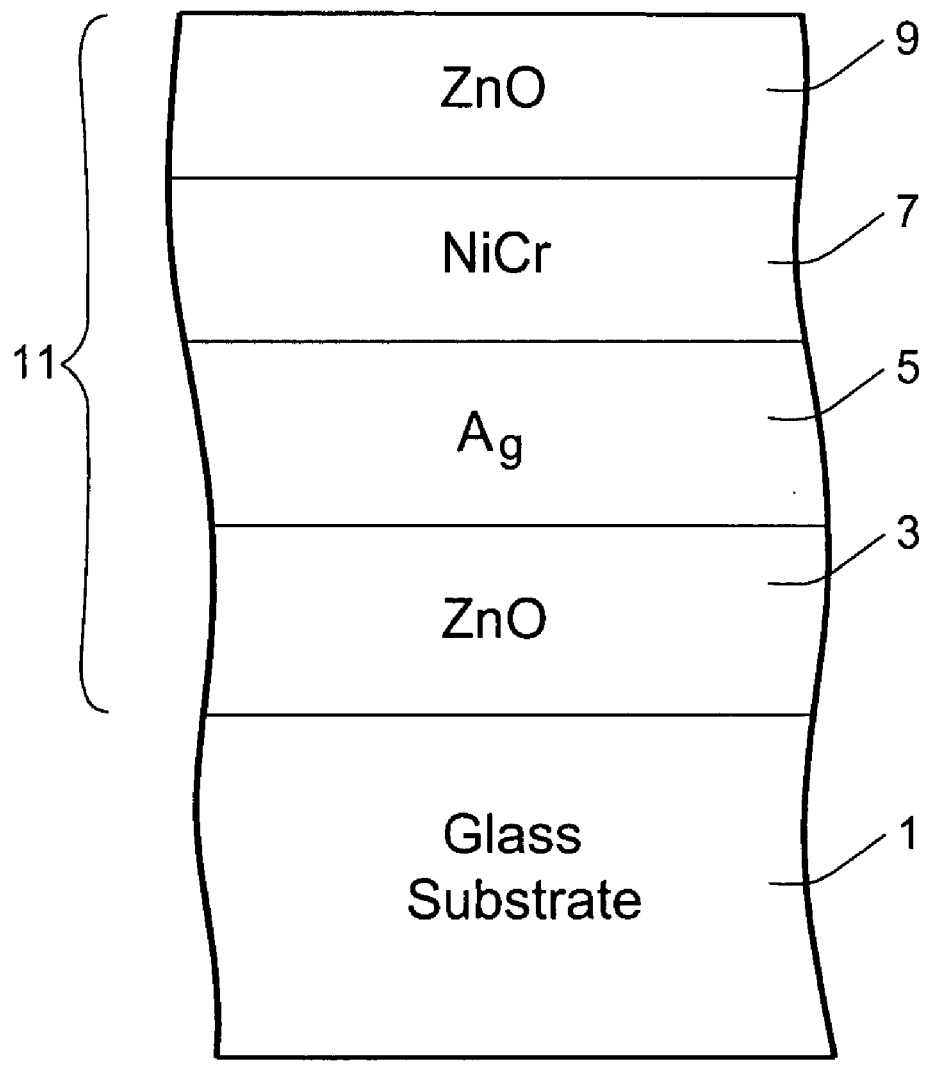
FIG. 2 is a cross sectional view of a coated article according to an example embodiment of this invention.

FIG. 1 is a schematic diagram illustrating a sputtering apparatus according to an example embodiment of this invention, including a target-substrate distance ($D_{TS}$) associated with the Ag target(s) used in sputtering IR reflecting layer(s). The target-to-substrate distance $D_{TS}$ shown in FIG. 1 is defined as the distance between the bottom-most surface of the target and the bottom side of the glass substrate 1. This may apply, for example and without limitation, to an 18 mm planar Ag cathode target in certain example instances. The bottom side of the glass substrate 1 is used as the measuring reference since it is an easy reference and is not affect by the number or thickness of layers on the top of the substrate when the substrate reaches the target(s) for the IR reflecting layer. Meanwhile, FIG. 2 is a cross sectional view of an example coated article that may be made using the sputtering apparatus of FIG. 1. The coated article shown in FIG. 2 includes glass substrate 1, dielectric layer 3 of or including ZnO, ZnAlO$_x$ or the like, IR reflecting layer 5 of or including Ag, Au or the like, contact layer 7 of or including NiCr, Ni, Cr, NiCrO$_x$, or the like, and overcoat dielectric layer 9 of or including ZnO, ZnAlO$_x$ or the like.

For instance, referring to FIGS. 1-2, during the process of forming the coating 11 on substrate 1, the glass substrate 1 moves in direction F under the sputtering targets as the substrate is supported by rollers R. The substrate 1 is typically a glass substrate, and is typically from about 1-10 mm thick, more preferably from about 1.5 to 6 mm thick. As the glass substrates moves in direction F, target(s) 21 is sputtered (e.g., via magnetron sputtering) to form dielectric layer 3 of or including ZnO, ZnAlO$_x$ or the like, target(s) 23 is sputtered to form IR reflecting layer 5 of or including Ag, Au or the like, and multiple targets 25 are sputtered to form contact layer 7 of or including NiCr, Ni, Cr, NiCrO$_x$, or the like, and dielectric layer 9 of or including ZnO, ZnAlO$_x$ or the like. Material M from the sputtering targets falls or is directed toward the substrate to form the layers of corresponding material.

Various types of sputtering targets may be used. DC sputtering, AC sputtering, or pulsed DC sputtering may be used to form the layer(s) in different embodiments of this invention. As an example, one, two or more of the targets may be of planar type, or alternatively of the magnetron type where magnetron sputtering is used to form the layers of corresponding material. Example targets, and example sputtering processes for such targets, which may be used in certain example embodiments of this invention are described in U.S. Pat. Nos. 5,425,861, 5,403,458, 6,558,800, 6,800, 179, and 6,576,349, the disclosures of which are hereby incorporated herein by reference.

For example, in certain example instances, the target(s) (23) for sputtering the IR reflecting layer 5 may be of Ag, and the targets (21 and/or 25) used for sputtering dielectric layers 3 and 9 of ZnAlO$_x$ may be of Zn doped with Al (e.g., from about 0-4% Al, more preferably from about 0-2% Al). As an example, an Ag target 23 may be sputtered in an Ar gas atmosphere (which may or may not include a small amount of oxygen) in order to form Ag IR reflecting layer 5. As another example, ZnAl targets may be sputtered in an atmosphere including oxygen and argon to form ZnO or ZnAlO$_x$ layers 3 and 9. As yet another example, a NiCr target may be sputtered in an argon atmosphere (which may or may not include oxygen) to form NiCr layer 7.

Surprisingly and unexpectedly, it has been found that properties of the IR reflecting layer(s) 5 can be improved by reducing the distance between the substrate and the sputtering target(s) used in forming the IR reflecting layer(s) (i.e., by reducing the distance $D_{TS}$).

In certain example embodiments of this invention, IR reflecting layer(s) 5 are formed by sputtering a target 23 which is located closer to the substrate 1 than conventionally. Conventionally, in certain instances Ag targets have been located in accordance with a target-substrate distance $D_{TS}$ of approximately 140 mm. However, in certain example embodiments of this invention, IR reflecting layer(s) 5 is/are formed by sputtering where the Ag target 23 being sputtering is located in accordance with a target-substrate distance $D_{TS}$ of less than or equal to about 110 mm, more preferably less than or equal to about 100 mm, more preferably less than or equal to about 95 mm, still more preferably less than or equal to about 90 mm, even more preferably less than or equal to about 80 mm. Given the definition of $D_{TS}$ herein, these distances are from the target to the bottom surface of the glass substrate. However, in certain other example embodiments of this invention, IR reflecting layer(s) 5 is/are formed by sputtering where the Ag target 23 being sputtering is located less than 105 mm from a top surface of the glass substrate 1, more preferably less than or equal to about 95 mm from the top surface of the glass substrate 1, even more preferably less than or equal to about 90 mm from the top surface of the glass substrate, still more preferably less than or equal to about 80 mm from the top surface of the glass substrate.

This reduced distance between the glass substrate and the target surprisingly results in the formation of IR reflecting layer(s) 5 having improved optical and/or electrical properties. For instance, it has been found that a reduction in the target-substrate distance $D_{TS}$ for a target(s) used in sputtering an IR reflecting layer(s) 5 results in an IR reflecting layer having one or more of the following advantages: (a) reduced sheet resistance ($R_s$), (b) reduced emittance or emissivity, (c) improved crystallinity, and/or (d) a higher and thus improved extinction coefficient (k). Another example advantage is that less power may be used to obtain the same thickness for an IR reflecting layer 5 compared to a layer of like material formed when the target is further from the substrate such as a $D_{TS}$ of about 130-140 mm (using less power may be advantageous in that it permits one to coat a larger quantity of glass using a particular target). In particular, with respect to using less power, a significant advantage in this respect is a better usage of target material; due to the shorter distance less silver is deposited on shields and surroundings and more goes directly on the substrate area being coated thereby reducing the material cost per square meter coated.

For example, moving from a $D_{TS}$ of about 130 mm to about 80 mm for the Ag target results in Ag IR reflecting films with overall lower specific resistivity and continuous films are obtained for thinner layers. XRD data also indicates improved crystallinity for Ag films at the 80 mm $D_{TS}$. A higher degree of crystallinity has been found to occur for the Ag when reducing the $D_{TS}$ for the Ag target. A slight increase in deposition rate may also occur.

While the reason for the aforesaid improvements due to reduced $D_{TS}$ are not perfectly understood, it is believed that the positioning of the Ag target or the like closer to the glass substrate moving below or over the target results in a change in local pressure proximate the target surface. It is believed that this changes in pressure may improve sputtering properties, resulting in reduced sheet resistance and/or reduced emittance in the sputtered IR reflecting layer(s). Moreover, the improved k values, resistivity, and emittance probably result from a more dense and more crystalline Ag film at the smaller $D_{TS}$ (this has been confirmed via XRD data).

In certain example embodiments of this invention, additional targets are used in forming the first and second dielectric layers 3 and 7 (e.g., see FIGS. 1-2). In certain example embodiments, the target(s) 23 used in forming the IR reflecting layer 5 is located closer to the substrate 1, or alternatively farther from the substrate, than are the additional targets 21 and/or 25 used in forming the first and second dielectric layers 3 and/or 7.

While the coating 11 shown in FIG. 2 may be made in certain example embodiments of this invention, this invention is not so limited. Any of various other types of coating can instead be made in accordance with this invention using reduced target-substrate distances. Typical coatings according to different embodiments of this invention often includes at least one IR reflecting layer (e.g., of or including Ag, Au or the like) sandwiched between at least first and second dielectric layers. Single silver stacks may be provided in certain instances, whereas double-silver stacks may be provided in other instances. For example, and without limitation, any of the coatings described in any of U.S. Pat. Nos. 5,425,861, 5,403,458, 6,558,800, 6,800,179, and 6,576,349 could instead be made, the disclosures of which are incorporated herein by reference.

In certain example embodiments of this invention, the low-E coating (e.g,. see coating 11 in FIG. 2, or any other suitable low-E coating) has a sheet resistance of less than or equal to about 10 ohms/square, more preferably less than or equal to about 8 ohms/square, even more preferably less than or equal to about 6 ohms/square, and most preferably less than or equal to about 4 ohms/square. Moreover, in certain example embodiments of this invention, the coated article has a visible transmission of at least about 50%, more preferably of at least about 60%, and most preferably of at least about 70% (in monolithic form, IG unit form, and/or laminated window form).

EXAMPLES

For purposes of example only and without limitation, the following examples were performed to illustrate example advantages associated with certain example embodiments of this invention. Below are Comparative Examples C1-C4, and Examples 1-4. In the below described examples, the Ag IR reflecting layer was sputtered and measured, with the results and process parameters listed below for the various examples. The layer stack for each example was as shown in FIG. 2, with all layers except the Ag IR reflecting layer 5 being the same in all examples. A single Ag planar cathode target was used to sputter the IR reflecting layer 5 in each example. Since the below Examples all have the same FIG. 2 stack except for the IR reflecting layer 5, only the data relating to the IR reflecting layer 5 is set forth below. Note that the thickness data identifies the thickness of the IR reflecting Ag layer in units of nm, and the sheet resistance ($R_s$) values are in units of ohms/square, and k and n were measured at 550 nm. Emittance is in units of %. The power used for the examples with a $D_{TS}$ of 140 mm was 12.0 kW (Examples C1, C2, C3 and C4), whereas the power used for Examples 1, 2, 3 and 4 with a $D_{TS}$ of 90 mm was 10.4 kW. Moreover, the power used for Example 1a with a $D_{TS}$ of 90 mm was 12 kW. Examples C1 and 1 were sputtered using gas flows of 250 ml/min Ar in the sputter chamber, whereas Examples C2 and 2 were sputtered using gas flows of 250 ml/min Ar and 75 ml/min Kr in the sputter chamber, Examples C3 and 3 were sputtered using gas flows of 250 ml/min Ar and 150 ml/min Kr in the sputter chamber, and Examples C4 and 4 were sputtered using gas flows of only 150 ml/min Ar in the sputter chamber. It will be shown from the below that the use of Kr gas in the sputter chamber surprisingly generally results in increased k vales for the Ag IR reflecting layer 5. Since Examples C1, C2, C3 and C4 have $D_{TS}$ values of 140 mm, they have a "C" in front of them to indicate that they are "Comparative" examples.

TABLE 1

| Example | Target | Thick(nm) | $D_{TS}$ (mm) | $R_s$ | Emittance | k | n |
|---|---|---|---|---|---|---|---|
| C1 | Ag | 11.03 | 140 | 3.7 | 4.0 | 3.925 | 0.191 |
| 1 | Ag | 11.05 | 90 | 3.6 | 4.0 | 4.041 | 0.188 |
| 1a | Ag | 11.97 | 90 | 3.2 | 3.4 | 4.192 | 0.165 |
| C2 | Ag | 11.29 | 140 | 3.6 | 4.1 | 3.920 | 0.178 |
| 2 | Ag | 10.80 | 90 | 3.6 | 4.1 | 4.183 | 0.184 |
| C3 | Ag | 10.68 | 140 | 3.5 | 3.9 | 4.074 | 0.171 |
| 3 | Ag | 11.24 | 90 | 3.4 | 3.8 | 4.139 | 0.182 |
| C4 | Ag | 10.87 | 140 | 3.5 | 3.8 | 4.135 | 0.178 |
| 4 | Ag | 11.36 | 90 | 3.3 | 3.8 | 4.156 | 0.180 |

It will be appreciated that Comparative Examples C1, C2, C3 and C4 have rather high $D_{TS}$ values for the Ag target of about 140 mm. In contrast, Examples 1, 2, 3 and 4 have much lower $D_{TS}$ values for the Ag target of about 90 mm. Moreover, the processing of Examples C1 and 1 was identical except for the difference in $D_{TS}$ and power, the processing of Examples C2 and 2 was identical except for the difference in $D_{TS}$ and power, the processing of Examples C3 and 3 was identical except for the difference in $D_{TS}$ and power, and the processing of Examples C4 and 4 was identical except for the difference in $D_{TS}$ and power. Also, the processing of Examples C1 and 1a was identical except for the difference in $D_{TS}$.

It can be seen by comparing the above Comparative Examples C1, C2, C3 and C4 with the corresponding Examples 1, 1a, 2, 3 and 4 that the reduction in $D_{TS}$ unexpectedly results in improved (higher) k values, improved (i.e., reduced) sheet resistance, and/or improved (i.e., reduced) emittance. For example, Examples C1 and 1a are identical except for the difference in $D_{TS}$; and Example 1a with the reduced $D_{TS}$ value of 90 mm had significantly improved sheet resistance ($R_s$), significantly improved emittance, and a significantly improved extinction coefficient (k) compared to Comparative Example C1. Similar results can be seen by comparing Examples C2 and 2, by comparing Examples C3 and 3, and by comparing Examples C4 and 4. It is noted that higher k values are indicative of better quality silver because higher k values are typically caused by a higher amount of free electrons in the conductivity band, which leads to a lower sheet resistance and a lower emittance.

It can also be seen that the use of Kr gas in the sputtering process improves k values of the resulting Ag IR reflecting layer 5. In particular, the layer's resistance is reduced, as is its emittance.

Figure 3:
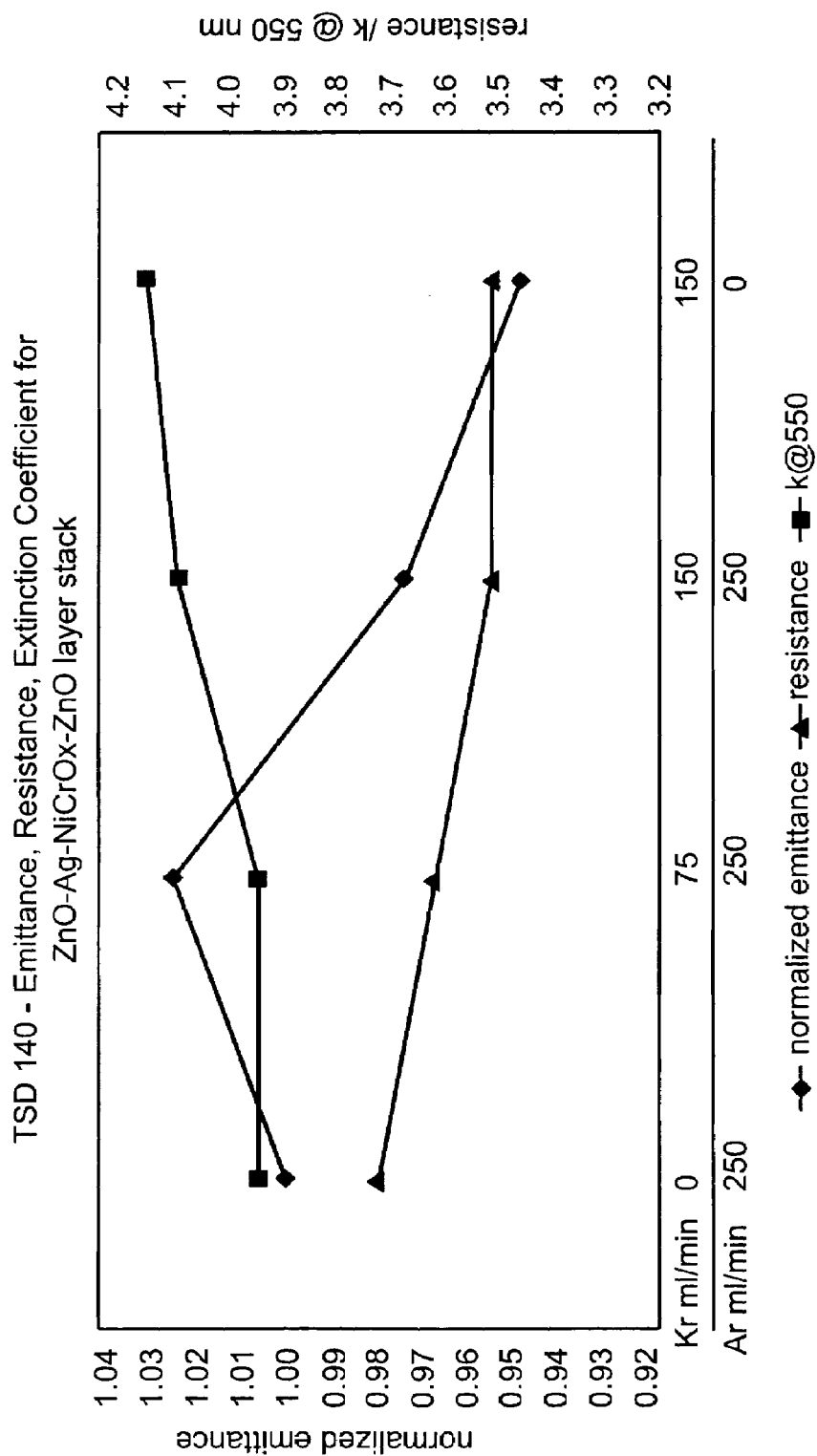
FIG. 3 is a graph illustrating emittance, sheet resistance, and k value data for examples discussed in the specification when using a $D_{TS}$ of about 140 mm.
Figure 4:
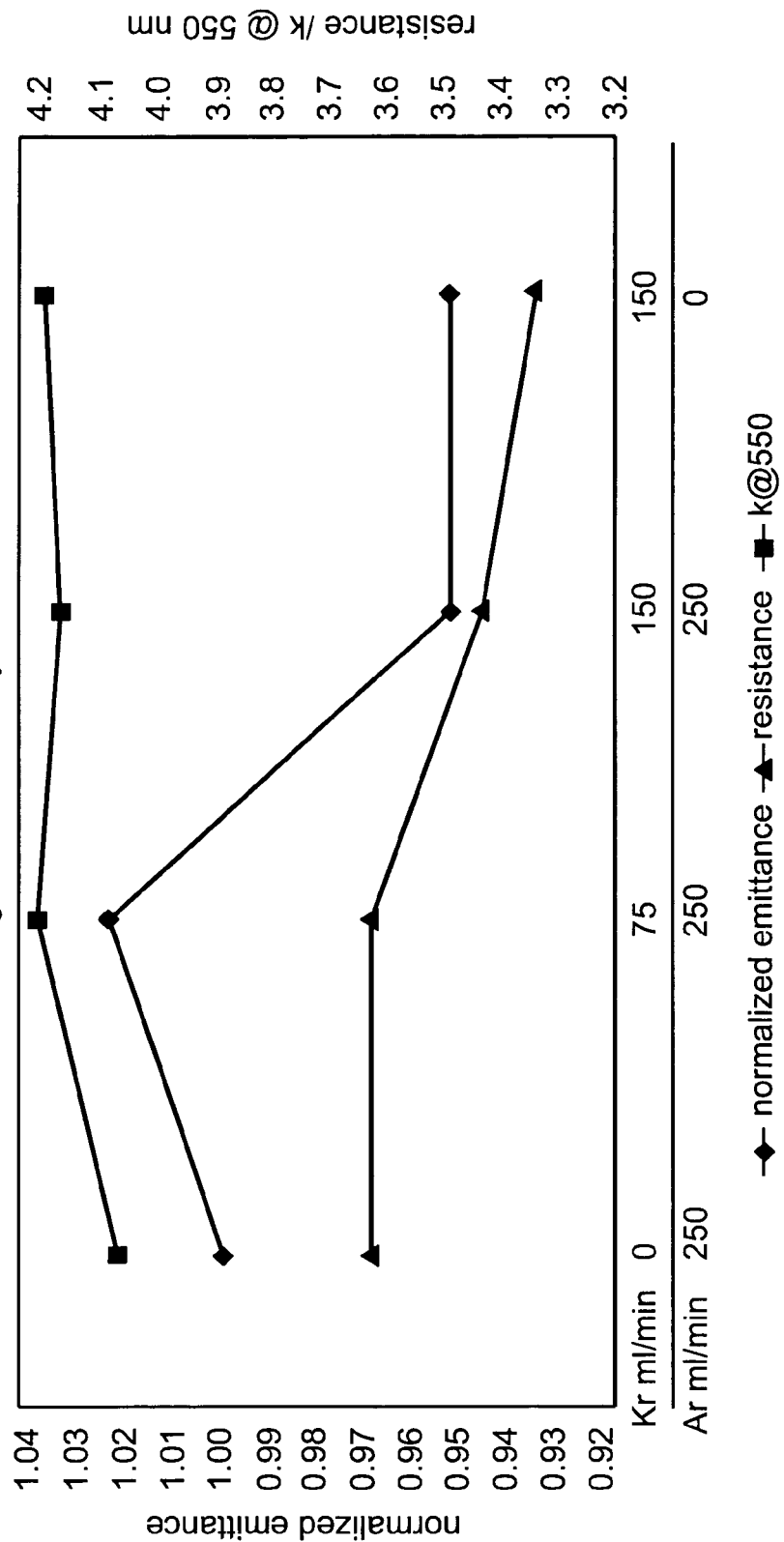
FIG. 4 is a graph illustrating emittance, sheet resistance, and k value data for examples according to this invention that are discussed in the specification when using a $D_{TS}$ of about 90 mm (comparing FIGS. 3 and 4 illustrates that improved characteristics are achieved with the reduced $D_{TS}$ in FIG. 4).

FIG. 3 plots the data points for Comparative Examples C1, C2, C3 and C4, whereas FIG. 4 plots the data points for Examples 1, 2, 3 and 4. The horizontal axis of the graphs is for gas flows used during sputtering. It can be seen that the reduced $D_{TS}$ for the targets used for FIG. 4 resulted in improved sheet resistance, emittance, and k value characteristics of the resulting Ag layers.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

The invention claimed is:

1. A method of making a coated article, the method comprising:
    forming a multi-layer low-E coating on a glass substrate, wherein the glass substrate is from about 1 to 10 mm thick and wherein the coating includes at least one infrared (IR) reflecting layer comprising Ag and at least first and second dielectric layers; and
    when forming the IR reflecting layer comprising Ag, sputtering a target comprising Ag that is located less than or equal to about 110 mm from a bottom surface of the glass substrate, so that the target comprising Ag is located closer to the glass substrate than are sputtering targets used in sputter-depositing the first and second dielectric layers of the coating.

2. The method of claim 1, further comprising, when forming the IR reflecting layer comprising Ag, sputtering a target comprising Ag that is located less than or equal to about 100 mm from the bottom surface of the glass substrate.

3. The method of claim 1, further comprising, when forming the IR reflecting layer comprising Ag, sputtering a target comprising Ag that is located less than or equal to about 95 mm from the bottom surface of the glass substrate.

4. The method of claim 1, further comprising, when forming the IR reflecting layer comprising Ag, sputtering a target comprising Ag that is located less than or equal to about 90 mm from the bottom surface of the glass substrate.

5. The method of claim 1, further comprising, when forming the IR reflecting layer comprising Ag, sputtering a target comprising Ag that is located less than or equal to about 80 mm from the bottom surface of the glass substrate.

6. The method of claim 1, further comprising, when forming the IR reflecting layer comprising Ag, sputtering a target comprising Ag that is located from about 40 to 90 mm from the bottom surface of the glass substrate.

7. The method of claim 1, further comprising, when forming the IR reflecting layer comprising Ag, sputtering a target comprising Ag that is located less than or equal to 90 mm from a top surface of the glass substrate.

8. The method of claim 1, wherein the target comprising Ag is a planar cathode target.

9. The method of claim 1, wherein the sputtering of the target comprising Ag is performed in a vacuum atmosphere at a pressure less than atmospheric pressure, and where at least Ar gas is provided in the vacuum atmosphere.

10. The method of claim 1, wherein the sputtering of the target comprising Ag is performed in an atmosphere comprising each of Ar and Kr gas.

11. The method of claim 10, wherein the atmosphere comprises more Kr gas than Ar gas.

12. The method of claim 1, wherein the sputtering of the target comprising Ag is performed in an atmosphere comprising at least Kr gas.

13. The method of claim 1, wherein the sputtering of the target comprising Ag is performed in an atmosphere comprising Ar gas.

14. The method of claim 1, wherein the first and second dielectric layers are provided on opposite sides of the IR reflecting layer.

15. The method of claim 1, wherein one or both of the first and second dielectric layers comprises zinc oxide.

16. The method of claim 1, wherein both of the first and second dielectric layers comprises metal oxide.

17. The method of claim 1, wherein the low-E coating comprises first and second IR reflecting layers comprising Ag, and wherein each of the first and second IR reflecting layers is formed by sputtering at least one target comprising Ag that is located less than or equal to about 110 mm from a bottom surface of the glass substrate.

18. The method of claim 1, wherein the low-E coating has a sheet resistance of less than or equal to about 10 ohms/square.

19. The method of claim 1, wherein the coated article has a visible transmission of at least about 50%.

20. The method of claim 1, wherein the coated article has a visible transmission of at least about 60%.

21. A method of making a coated article, the method comprising:
    forming a multi-layer coating on a substrate, wherein the coating includes at least one infrared (IR) reflecting layer; and
    when forming the IR reflecting layer, sputtering at least one target comprising at least one metal that is located less than or equal to about 110 mm from a bottom surface of the substrate, so that the target used in forming the IR reflecting layer is located closer to the substrate than are sputtering targets used in sputter-depositing respective first and second dielectric layers of the multi-layer coating.

22. The method of claim 21, further comprising, when forming the IR reflecting layer, sputtering the target wherein the target is located less than or equal to about 100 mm from the bottom surface of the substrate.

23. The method of claim 21, further comprising, when forming the IR reflecting layer, sputtering the target wherein the target is located less than or equal to about 90 mm from the bottom surface of the substrate.

24. The method of claim 21, further comprising, when forming the IR reflecting layer, sputtering the target and wherein the target is located from about 40 to 90 mm from the bottom surface of the substrate.

25. The method of claim 21, further comprising, when forming the IR reflecting layer, sputtering the target and wherein the target is located less than or equal to 90 mm from a top surface of the substrate.

26. The method of claim 21, wherein the at least one target used in forming the IR reflecting layer comprises Ag and/or Au, and is a planar cathode target.

27. The method of claim 21, wherein the sputtering of the at least one target used in forming the IR reflecting layer is performed in an atmosphere comprising each of Ar and Kr gas.

28. The method of claim 27, wherein the atmosphere comprises more Kr gas than Ar gas.

29. The method of claim 21, wherein the sputtering of the at least one target used in forming the IR reflecting layer is performed in an atmosphere comprising at least Kr gas.

30. The method of claim 21, wherein the sputtering of the at least one target used in forming the IR reflecting layer is performed in an atmosphere comprising Ar gas.

31. The method of claim 21, wherein the first and second dielectric layers are provided on opposite sides of the IR reflecting layer.

32. The method of claim 31, wherein the first and second dielectric layers each comprise zinc oxide.

33. The method of claim 21, wherein the coating has a sheet resistance of less than or equal to about 10 ohms/square.

34. The method of claim 21, wherein the coated article has a visible transmission of at least about 50%.

35. A method of making a coated article, the method comprising:
  forming a multi-layer coating on a glass substrate, the coating comprising a layer comprising Ag located between at least first and second dielectric layers;
  in forming the layer comprising Ag, sputtering at least one target comprising Ag in an atmosphere that includes Kr gas, so that the target comprising Ag is located closer to the glass substrate than are sputtering targets used in sputter-depositing the first and second dielectric layers.

36. The method of claim 35, wherein the atmosphere comprises each of Ar and Kr gas.

37. The method of claim 36, wherein the atmosphere comprises more Kr gas than Ar gas.

38. The method of claim 35, wherein the atmosphere is at a pressure less than atmospheric pressure during at least part of said sputtering.

* * * * *